United States Patent
Nishihara et al.

(10) Patent No.: US 10,027,408 B2
(45) Date of Patent: Jul. 17, 2018

(54) MULTI-CARRIER OPTICAL TRANSMISSION SYSTEM, OPTICAL TRANSMITTER, AND OPTICAL RECEIVER

(71) Applicant: FUJITSU LIMITED, Kawasaki-shi, Kanagawa (JP)

(72) Inventors: Masato Nishihara, Kawasaki (JP); Toshiki Tanaka, Setagaya (JP); Yutaka Kai, Kawasaki (JP); Tomoo Takahara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/179,075

(22) Filed: Jun. 10, 2016

(65) Prior Publication Data
US 2016/0285548 A1    Sep. 29, 2016

Related U.S. Application Data

(63) Continuation of application No. PCT/JP2013/083498, filed on Dec. 13, 2013.

(51) Int. Cl.
*H04B 10/07*    (2013.01)
*H04J 14/00*    (2006.01)
(Continued)

(52) U.S. Cl.
CPC ... *H04B 10/07953* (2013.01); *H04B 10/0795* (2013.01); *H04B 10/40* (2013.01);
(Continued)

(58) Field of Classification Search
CPC ...... H04B 10/50; H04B 10/61; H04B 10/564; H04B 10/40; H04B 10/0795; H04B 10/07953; H01S 5/062
(Continued)

(56) References Cited

U.S. PATENT DOCUMENTS 4,893,300 A * 1/1990 Carlin ........................ H04J 1/14
                                                      398/32
5,020,049 A * 5/1991 Bodeep ............... H01S 5/06213
                                                    348/E7.094
(Continued)

FOREIGN PATENT DOCUMENTS

JP    06-303196    10/1994
JP    11-127119    5/1999
(Continued)

OTHER PUBLICATIONS

Mortazy et al, A new model for optical communication systems, Sep. 2004, Tarbiat Modarres University, All Document.*
(Continued)

*Primary Examiner* — Ken N Vanderpuye
*Assistant Examiner* — Dibson Sanchez
(74) *Attorney, Agent, or Firm* — Fujitsu Patent Center

(57) ABSTRACT

An optical transmitter transmits to an optical receiver a multi-carrier modulated signal light by driving a light source with a modulated signal modulated with a multi-carrier modulation scheme. The optical receiver monitors reception characteristic of any of subcarrier signals included in the modulated signal and transmits a monitor result to the optical transmitter. The optical transmitter controls drive conditions of the light source based on the monitor result received from the optical receiver.

11 Claims, 12 Drawing Sheets

(51) Int. Cl.
*H04B 10/079* (2013.01)
*H04B 10/564* (2013.01)
*H04B 10/40* (2013.01)
*H04B 10/50* (2013.01)
*H04B 10/61* (2013.01)
*H01S 5/062* (2006.01)

(52) U.S. Cl.
CPC ........... *H04B 10/50* (2013.01); *H04B 10/564* (2013.01); *H04B 10/61* (2013.01); *H01S 5/062* (2013.01)

(58) Field of Classification Search
USPC ................................................ 398/25–38, 76
See application file for complete search history.

(56) References Cited

U.S. PATENT DOCUMENTS

| | | | | |
|---|---|---|---|---|
| 5,225,922 | A * | 7/1993 | Chraplyvy | H04J 14/0221 398/197 |
| 5,623,355 | A * | 4/1997 | Olsen | H01S 5/06835 398/162 |
| 5,680,238 | A * | 10/1997 | Masuda | H04J 14/0298 398/76 |
| 5,995,256 | A * | 11/1999 | Fee | H04J 14/0241 398/1 |
| 6,157,475 | A * | 12/2000 | Dugan | H04B 10/25073 385/140 |
| 6,771,904 | B1 * | 8/2004 | Sasaki | H04B 10/0775 398/16 |
| 7,113,667 | B2 * | 9/2006 | Welch | B82Y 20/00 385/14 |
| 7,113,708 | B1 * | 9/2006 | Creaney | H04B 10/07955 398/140 |
| 7,693,429 | B1 * | 4/2010 | Lowery | H04B 10/548 398/182 |
| 7,734,191 | B1 * | 6/2010 | Welch | B82Y 20/00 398/158 |
| 8,204,377 | B2 * | 6/2012 | Liu | H04B 10/255 398/158 |
| 2002/0048062 | A1 * | 4/2002 | Sakamoto | H04J 14/0221 398/30 |
| 2002/0063934 | A1 * | 5/2002 | Sakauchi | H04B 10/2513 398/141 |
| 2002/0097473 | A1 * | 7/2002 | McKiel, Jr. | H04J 14/0298 398/141 |
| 2002/0190666 | A1 * | 12/2002 | Sakamoto | H01S 5/06804 315/291 |
| 2003/0002125 | A1 | 1/2003 | Fuse | |
| 2003/0044108 | A1 * | 3/2003 | Jacobowitz | G02B 6/278 385/24 |
| 2003/0118063 | A1 * | 6/2003 | Sugawara | H01S 5/06835 372/38.02 |
| 2004/0131365 | A1 | 7/2004 | Lee et al. | |
| 2004/0156644 | A1 * | 8/2004 | Yasue | H04B 10/5057 398/198 |
| 2004/0196873 | A1 * | 10/2004 | Barkaro | H04L 5/0046 370/527 |
| 2005/0123299 | A1 * | 6/2005 | Sakata | H04J 14/02 398/79 |
| 2005/0265730 | A1 | 12/2005 | Yasue et al. | |
| 2009/0168855 | A1 * | 7/2009 | Balamurugan | H04L 25/0282 375/220 |
| 2009/0180778 | A1 * | 7/2009 | Rhee | H04B 10/548 398/79 |
| 2009/0220239 | A1 * | 9/2009 | Armstrong | H04B 10/25133 398/81 |
| 2010/0142637 | A1 * | 6/2010 | Hu | H04L 25/03159 375/260 |
| 2012/0020381 | A1 * | 1/2012 | Ishizaka | H01S 5/06804 372/38.02 |
| 2014/0186029 | A1 * | 7/2014 | Khoury | H04B 10/073 398/27 |
| 2016/0197679 | A1 * | 7/2016 | Tanaka | H04B 10/572 398/79 |

FOREIGN PATENT DOCUMENTS

| | | |
|---|---|---|
| JP | 2004-7326 | 1/2004 |
| JP | 2004-215277 | 7/2004 |
| JP | 2006-527573 | 11/2006 |

OTHER PUBLICATIONS

Zihad et al, High Speed Data Transmission through Optical Fiber using 1550nm Semiconductor Laser, May 2013, American International University of Bangladesh, All Document.*
Vankwikelberge et al, Analysis of the Carrier Induced FM Response of DFB Lasers Theoretical and Experimental Case Studies, Nov. 1989, IEEE, All Document.*
Jin et al, Real time transmission of 3Gbs 16 QAM encoded optical OFDM signals over 75 km SMFs with negative power penalties, Aug. 2009, OSA, All Document.*
T. Tanaka et al., "50 Gbps Class Transmission in Single Mode Fiber using Discrete Multi-tone Modulation with 10G Directly Modulated Laser", OFC/NFOEC Technical Digest 2012 (3 pages), cited in ISR for PCT/JP2013/083498.
International Search Report and Written Opinion of the International Searching Authority (Form PCT/ISA/210, Form PCT/ISA/237), mailed in connection with PCT/JP2013/083498 and dated Feb. 10, 2014, partial English translation (7 pages).
JPOA—Office Action of Japanese Patent Application No. 2015-552274 dated Jul. 4, dated 2017, with relevant English translation.

* cited by examiner

FIG. 11

| SNR@7GHz | SNR@28GHz | BIAS CURRENT | DRIVE AMPLITUDE |
|---|---|---|---|
| 20 dB | 10 dB | 60 mA | 40 mA |
| 20 dB | 12 dB | 80 mA | 40 mA |
| 25 dB | 10 dB | 60 mA | 60 mA |
| 25 dB | 12 dB | 80 mA | 60 mA |

141

MULTI-CARRIER OPTICAL TRANSMISSION SYSTEM, OPTICAL TRANSMITTER, AND OPTICAL RECEIVER

CROSS-REFERENCE TO RELATED APPLICATION

This application is a continuation application of International Application PCT/JP2013/83498, filed on Dec. 13, 2013 and designated the U.S., the entire contents of which are incorporated herein by reference.

FIELD

The embodiment discussed herein is related to a multi-carrier optical transmission system, an optical transmitter, and an optical receiver.

BACKGROUND

In recent years, with increasing transmission traffic, demand for larger capacities of optical transmission systems is increasingly on the rise. In short-distance transmission systems, not only larger capacities but also low-cost and simple configurations are demanded.

Thus, an application of a discrete multi-tone (DMT) modulation scheme to an optical transmission system has been discussed. The DMT modulation scheme is one of multi-carrier transmission technologies based on an orthogonal frequency division multiplexing (OFDM) technology and is used in a digital subscriber line (DSL) technology such as an asymmetric DSL (ADSL).

The DMT modulation scheme uses a "bit loading" which allocates bit numbers to each subcarrier in accordance with its transmission characteristic. Examples of the transmission characteristic may include a signal to noise ratio (SNR) and/or a bit error rate (BER). The transmission characteristic may also be referred to as a transmission condition. For example, more bits are allocated to a subcarrier with a high transmission characteristic than to a subcarrier with a low transmission characteristic. Thus, it is possible to improve a spectral efficiency.

When the DMT modulation scheme is installed in an optical transmission system, an electric/optic (E/O) converter using a direct modulation scheme for a semiconductor laser is applicable to an optical transmitter. Further, an optic/electric (O/E) converter using a light reception element such as a PD (photo detector or photo diode) is applicable to an optical receiver.

The semiconductor laser and the PD are general-purpose optical devices and thus are inexpensive. In the direct modulation scheme, a modulated signal is generated by modulating a drive current of the semiconductor laser that is a light source with transmission information. When compared with an external modulation scheme using an optical modulator in addition to a light source, the direct modulation scheme is difficult in a speedup but is possible to achieve downsizing and cost reduction because it is unnecessary to use phase information of a signal light. The semiconductor laser used in the direct modulation scheme may be referred to as a direct modulation laser (DML).

Therefore, by installing the DMT modulation scheme in an optical transmission system, it is possible to provide an optical transmission system available to improve a spectral efficiency (in other words, improve transmission capacities) and available to achieve downsizing and cost reduction.

As examples of optical transmission technology, there are technologies described in JP 11-127119 A and JP 6-303196 A.

For example, in a transmitting side, a transmission analog signal is multiplexed with a pilot signal which has a single frequency in a frequency band far apart from that of the transmission analog signal and has a fixed amplitude and the multiplexed signals are transmitted to an optical transmission line. Then, variations of a transmission gain in the optical transmission line are monitored by monitoring the pilot signal halfway through the optical transmission line and a gain of a variable gain amplifier provided on the optical transmission line is controlled so that the monitored value is constant.

As another example, an optical reception unit detects an instantaneous worst value of distortion of a reception signal to feedback the detected value to an optical transmission unit. The optical transmission unit determines a modulation level of a frequency multiplexed digital signal light to be transmitted and the number of frequency division multiplexing channels based on the received instantaneous worst value.

In an optical transmission system using the direct modulation scheme, a transmission characteristic changes depending on drive conditions (for example, the amplitude and a bias current of a drive current) of a semiconductor laser that is an example of a light source. Thus, it is preferable to optimize the drive conditions of the semiconductor laser to ensure transmission characteristics expected for an optical transmission system.

Further, unlike an NRZ (Non-Return-to-Zero) scheme, since the DMT modulation scheme changes a bit allocation (or multi-level modulation format) and/or transmission power of each subcarrier in accordance with the transmission characteristics, it is preferable to optimize the drive conditions of the semiconductor laser for each transmission characteristic.

In the technologies described above, however, no discussion has been made in an application of the DMT modulation scheme to an optical transmission system. Therefore, no discussion has also been made in optimizing drive conditions of the semiconductor laser in accordance with the transmission characteristics.

SUMMARY

An aspect of an optical transmission system may include an optical transmitter and an optical receiver. The optical transmitter may transmit a multi-carrier modulated signal light by driving a light source with a modulated signal modulated by using a multi-carrier modulation scheme. The optical receiver may receive the multi-carrier modulated signal light transmitted by the optical transmitter to demodulate the modulated signal. The optical receiver may monitor a reception characteristic of any of subcarrier signals included in the modulated signal and transmit a monitor result obtained by the monitoring to the optical transmitter. The optical transmitter may control a drive condition of the light source based on the monitor result received from the optical receiver.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 is a diagram illustrating an example of a table stored in a laser drive controller in the optical transmitter illustrated in FIG. 1.

DESCRIPTION OF EMBODIMENTS

Figure 1:
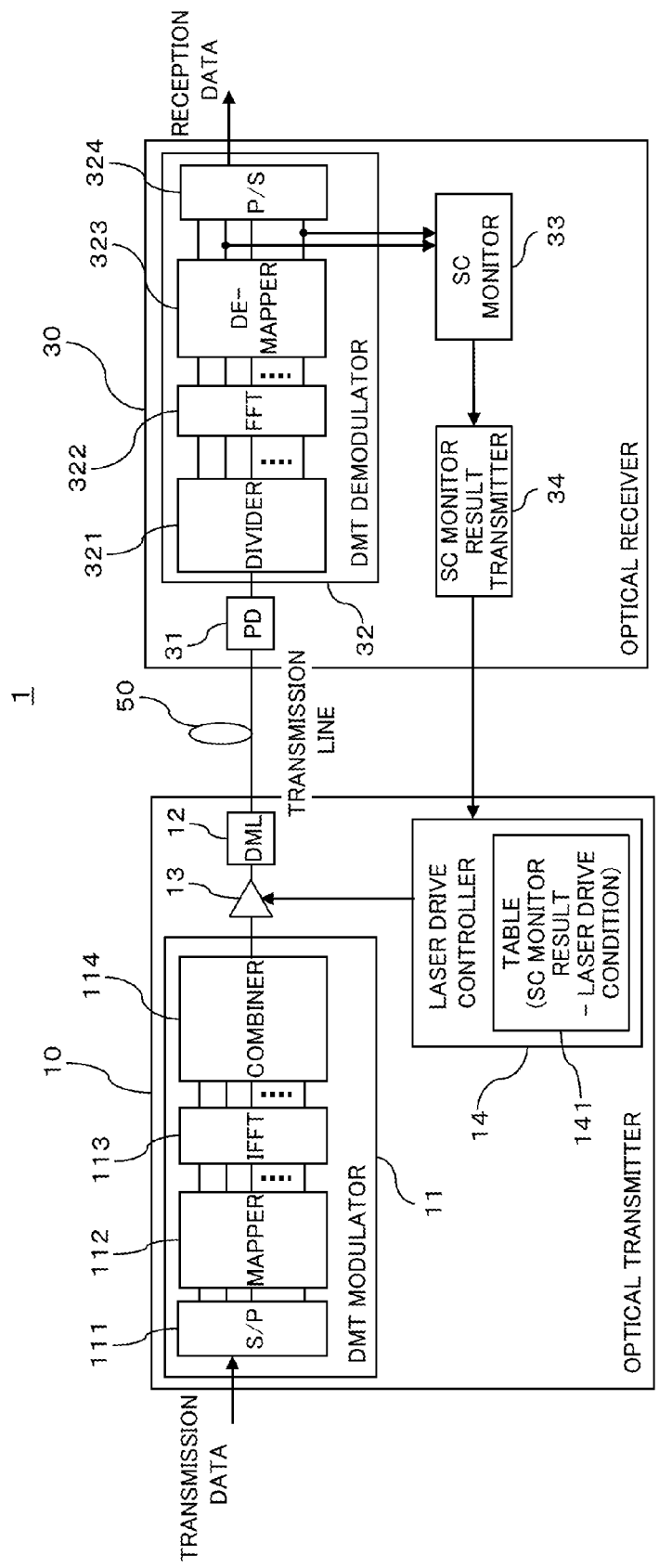
FIG. 1 is a block diagram illustrating a configuration of a multi-carrier optical transmission system applied with a DMT modulation scheme, according to an embodiment.

Hereinafter, an embodiment will be described with reference to the drawings. However, the embodiment described below is only by way of example and does not intend to exclude application of various modifications and technologies that are not described explicitly below. Further, various illustrative aspects described below may be carried out by appropriately combining such aspects. Incidentally, portions to which the same reference signs are given in the drawings used for the embodiment below represent the same or similar portions unless otherwise stated.

FIG. 1 is a block diagram illustrating a configuration example of a multi-carrier optical transmission system applied with a DMT modulation scheme, according to an embodiment. A multi-carrier optical transmission system 1 illustrated in FIG. 1 includes, for example, an optical transmitter 10 and an optical receiver 30 connected to the optical transmitter 10 via an optical transmission line 50 using an optical transmission medium such as an optical fiber. One or more of optical amplifiers may be provided on the optical transmission line 50.

The optical transmitter 10 converts transmission data modulated by the DMT modulation scheme into a signal light by using the direct modulation scheme and transmits the obtained transmission modulated signal light to the optical transmission line 50. The DMT modulation scheme is an example of the multi-carrier modulation scheme. The transmission modulated signal light may be referred to as a DMT modulated signal light. The DMT modulated signal light is an example of a multi-carrier modulated signal light.

The optical receiver 30 converts the DMT modulated signal light received from the optical transmission line 50 into an electric signal and performs a DMT-demodulation on the electric signal to obtain reception data.

(Optical Transmitter)

Thus, the optical transmitter 10 may include, for example, a DMT modulator 11, a direct modulation laser (DML) 12, a DML driver 13, and a laser drive controller 14.

The DMT modulator 11 is an example of a multi-carrier modulator and applies a DMT-modulation to transmission data of an electric signal to generate a DMT modulated signal. Thus, the DMT modulator 11 may include, for example, a serial to parallel (S/P) converter 111, a mapper 112, an inverse fast Fourier transformer (IFFT) 113, and a combiner 114.

The S/P converter 111 performs an S/P-conversion on transmission data to generate parallel data whose numbers are according to the number of subcarriers and input the parallel data into the mapper 112.

Figure 2:
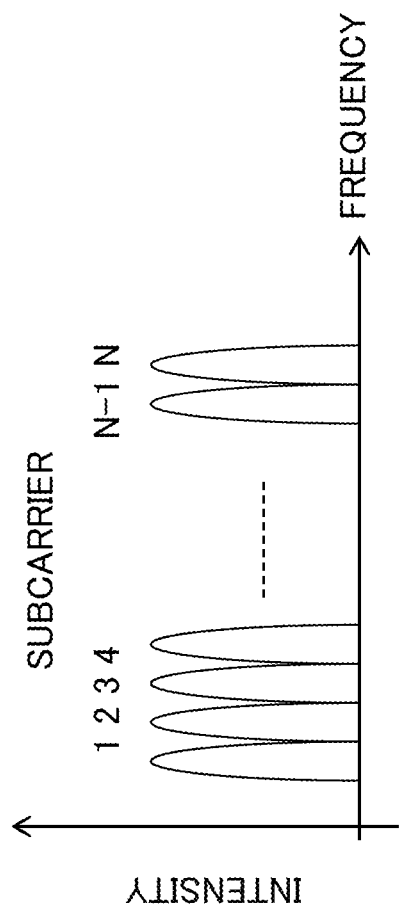
FIG. 2 is a diagram illustrating an example of an arrangement of subcarriers in the multi-carrier optical transmission system illustrated in FIG. 1.

The mapper 112 maps the parallel data having digital bit sequences input from the S/P converter 111 to a symbol on a complex plane, which is also referred to as an IQ plane, for each subcarrier. The mapping may also be referred to as a "subcarrier modulation". An exemplary arrangement of the subcarriers is illustrated in FIG. 2. FIG. 2 illustrates a case where N (N is an integer equal to 2 or greater) subcarriers are set in a frequency domain. The number 1 to N represent a subcarrier number.

Figure 3:
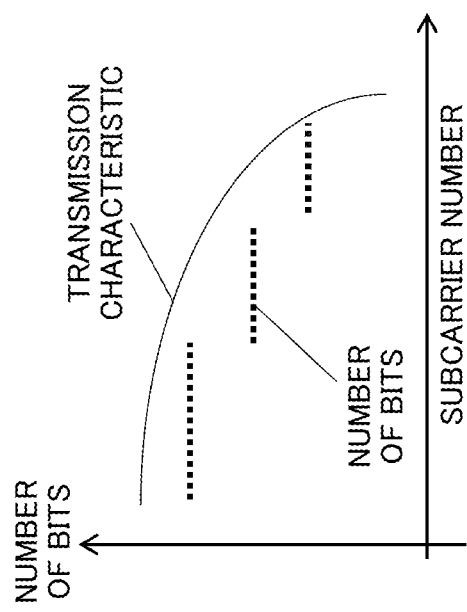
FIG. 3 is a diagram illustrating an overview of the DMT modulation scheme in the multi-carrier optical transmission system illustrated in FIG. 1.

In the DMT modulation scheme, it is available to allocate more bits to a subcarrier having a high transmission characteristic than to a subcarrier having a low transmission characteristic for each symbol. As illustrated in FIG. 3, when the transmission characteristic becomes better with a decreasing subcarrier number of the subcarrier, it is available to allocate more bits to a subcarrier having a small subcarrier number than to a subcarrier having a large subcarrier number for each symbol.

The number of allocated bits may correspond to a multi-level of the subcarrier modulation. For example, when a quadrature phase shift keying (QPSK) is applied to the subcarrier modulation, the multi-level corresponds to 2. When a $2^M$-QAM (Quadrature Amplitude Modulation) is applied to the subcarrier modulation, the multi-valued level corresponds to M (M=4, 6, 8 and so on).

The IFFT 113 performs IFFT processing on signal, which is mapped to a symbol for each subcarrier by the mapper 112 in the frequency domain, to convert the signal into a time domain.

The combiner 114 combines signals in the time domain obtained by the IFFT 113 to generates a DMT modulated signal.

The DML driver 13 amplifies the DMT modulated signal obtained by the DMT modulator 11 (for example, by the combiner 114) such that drive conditions (for example, the bias current and the amplitude) determined by the laser drive controller 14 are satisfied to generate a drive current for the DML 12.

The DML 12 is an example of the light source and may be a semiconductor laser, for example. The DML 12 varies in its light emission power in accordance with the DMT modulated drive current given from the DML driver 13 to generate a DMT modulated signal light and output the generated DMT modulated signal light to the optical transmission line 50.

Figure 4:
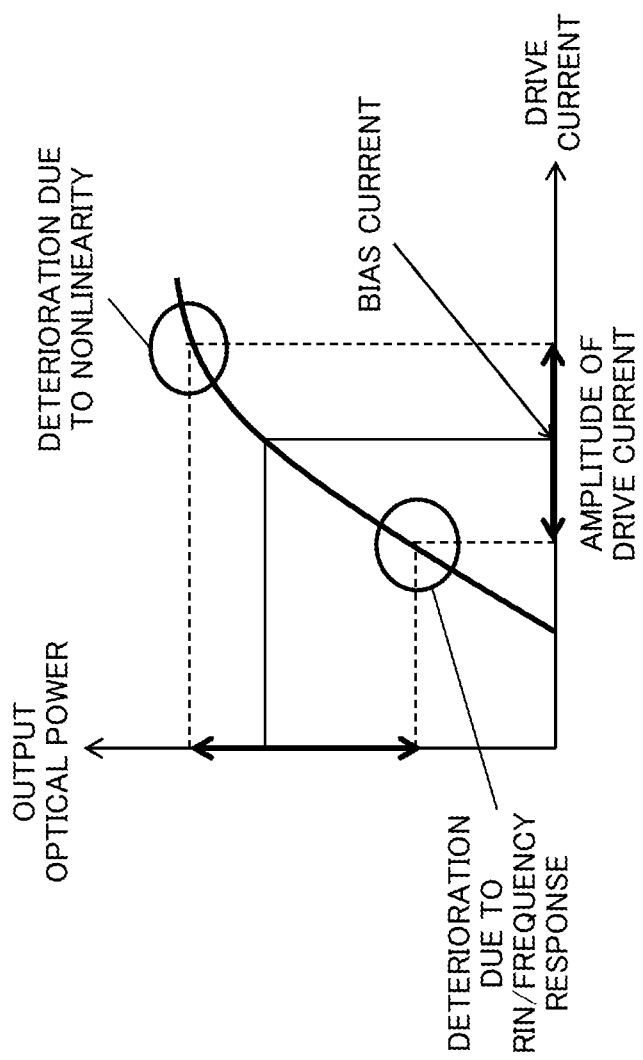
FIG. 4 is a diagram illustrating a characteristic example of output optical power with respect to a drive current of a direct modulation laser used in an optical transmitter illustrated in FIG. 1.
Figure 5:
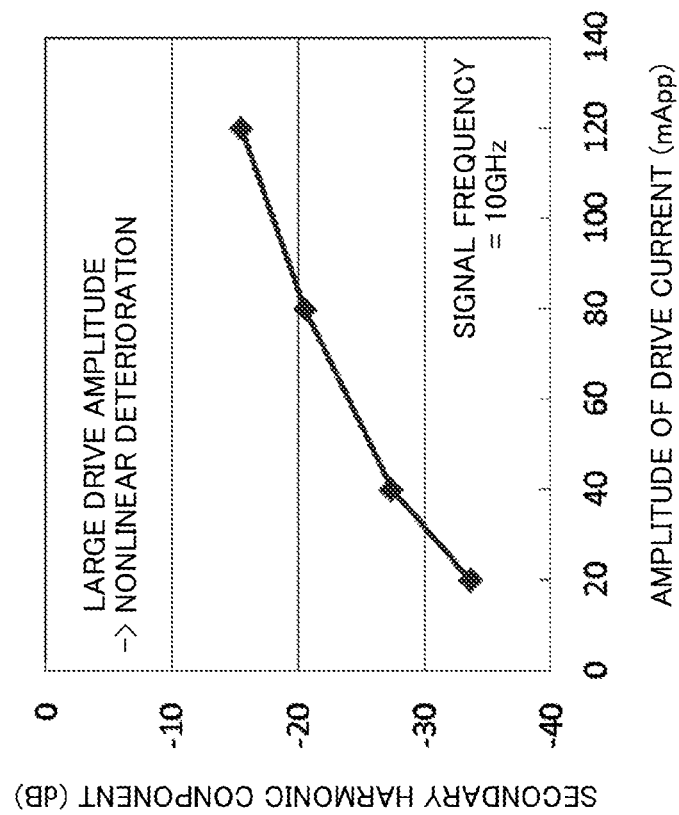
FIG. 5 is a diagram illustrating a characteristic example of a secondary harmonic component with respect to an amplitude of the drive current, which is one of characteristics of the direct modulation laser used in the optical transmitter illustrated in FIG. 1.
Figure 6:
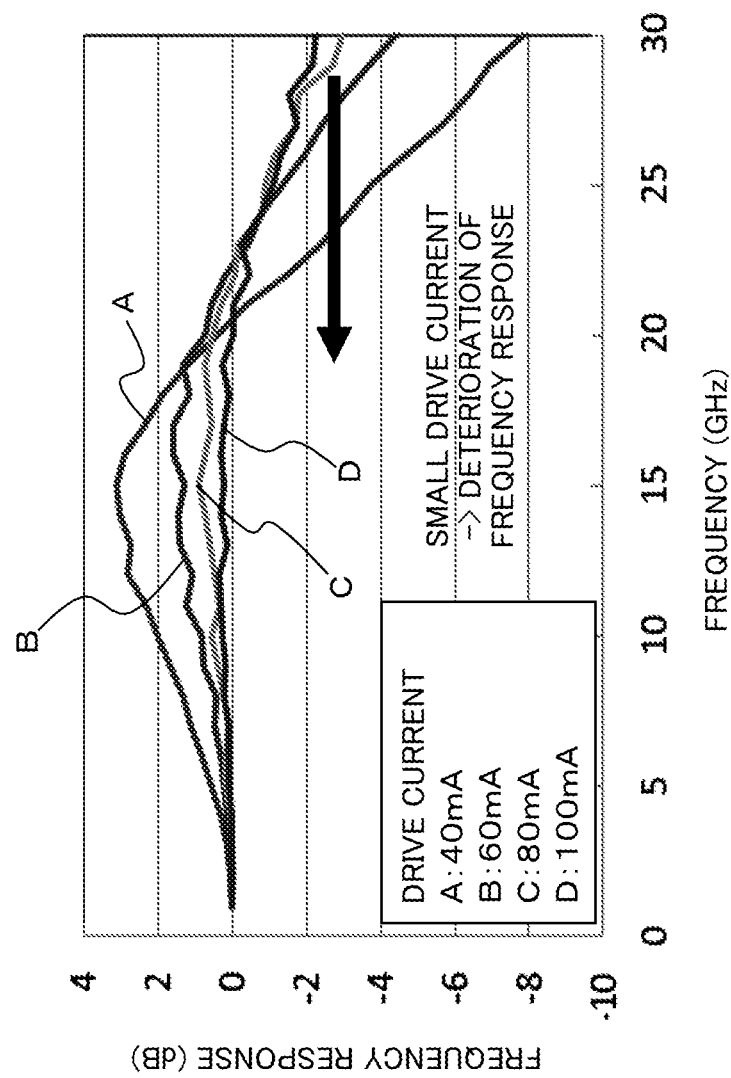
FIG. 6 is a diagram illustrating a characteristic example of a frequency response with respect to a frequency, which is one of characteristics of the direct modulation laser used in the optical transmitter illustrated in FIG. 1.
Figure 7:
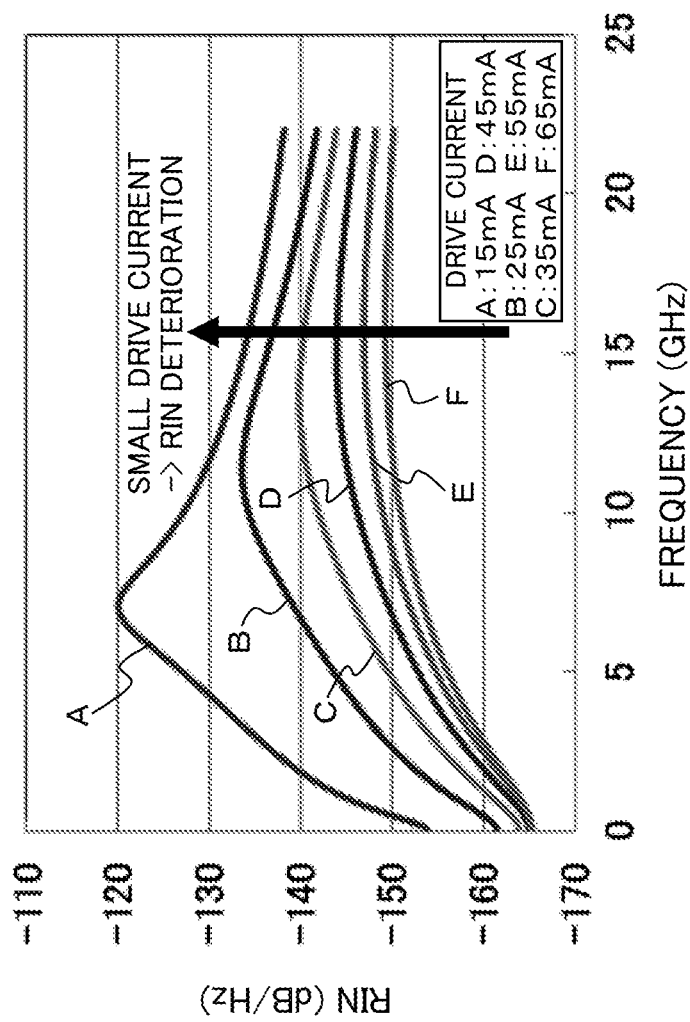
FIG. 7 is a diagram illustrating a characteristic example of relative intensity noise (RIN) with respect to a frequency, which is one of characteristics of the direct modulation laser used in the optical transmitter illustrated in FIG. 1.

The laser drive controller 14 controls the drive conditions of the DML 12 given by the DML driver 13. The drive conditions of the DML 12 may also be referred to as "laser drive conditions". FIG. 4 illustrates an example of the relationship between the drive current of the DML 12 and output optical power of the DML 12. FIGS. 5, 6, and 7 illustrate examples of a secondary harmonic component characteristic, a frequency characteristic, and a relative intensity noise (RIN) characteristic with respect to the frequency when the drive amplitude is changed, respectively. These characteristics are examples of characteristics of the DML 12. The RIN is obtained by normalizing fluctuations of light intensity caused by interference between a stimulated emission light and a spontaneous emission light in a laser light using average optical power.

As illustrated in FIG. 4, the output optical power of the DML 12 is varied by causing a drive current to vary in a certain amplitude in positive and negative directions relative to the bias current value. The amplitude of a drive current may be referred to as a "drive amplitude". It is possible to operate the DML 12 in a linear region by setting the bias current value and the drive amplitude appropriately.

However, when the drive amplitude is too large, the DML 12 operates in a nonlinear region and, as illustrated in FIG. 5, since the secondary harmonic component increases in output optical power of the DML 12, the transmission characteristic is deteriorated.

On the other hand, when the drive amplitude is too small, as illustrated in FIG. 6, the band of the frequency characteristic becomes narrower. For example, when frequency responses (dB) at the drive currents are 40 mA, 60 mA, 80 mA, and 100 mA as indicated by symbols A to D respectively are compared, the band in which the same frequency response as that when the drive current is the largest 100 mA is obtained becomes narrower with decreasing in the drive current.

Also, as illustrated in FIG. 7, the RIN increases with decreasing in the drive current and the transmission characteristic is deteriorated. FIG. 7 illustrates the RINs (dB/Hz) with respect to frequencies when the drive currents are 15 mA, 25 mA, 35 mA, 45 mA, 55 mA, and 65 mA as indicated by symbols A to F, respectively.

Therefore, in order to ensure the transmission characteristic (for example, SNR, BER or the like) expected for the multi-carrier optical transmission system 1, it is important to optimize drive conditions of the DML 12. Further, since the multi-level and transmission power for each subcarrier are optimized in accordance with the transmission characteristic in the DMT modulation scheme, it is important to optimize the drive conditions of the DML 12 for each transmission characteristic.

Characteristics (hereinafter, may also be referred to as "laser characteristics") of the DML 12 are affected by the RIN and the frequency response depending on the frequency, as described above. Thus, there is a subcarrier (or frequency) affected by the RIN and the frequency response more than any other subcarrier.

In the present embodiment, therefore, the reception characteristic (for example, SNR, BER or the like) of such subcarrier signal is monitored (or measured) by the optical receiver 30 (for example, a subcarrier monitor 33 described below), and drive conditions of the DML 12 are controlled based on the monitor result.

The monitor result can be transmitted (or fed back) to the optical transmitter 10 through an optical transmission line (omitted in FIG. 1) that transmits light in the opposite direction in the optical transmission line 50. For example, the monitor result can be set to an optical supervisory channel (OSC) signal that is an example of monitor control signal light.

Therefore, the laser drive controller 14 illustrated in FIG. 1 determines the drive conditions of the DML 12 based on the monitor result fed back from the optical receiver 30. For example, the laser drive controller 14 may store a table 141 in which a combination (or correspondence) of an SC monitor result and laser drive conditions are set and determine the drive conditions based on the monitor result with reference to the table 141.

The table 141 may also be referred to as an SC monitor result-laser drive conditions table 141. The table 141 may be stored in a storage unit (not illustrated) such as a memory provided in the laser drive controller 14. An exemplary content of the table 141 will be described below with reference to FIG. 11.

(Optical Receiver)

Next, the optical receiver 30 illustrated in FIG. 1 may include, for example, a PD (photo detector or photo diode) 31 as an example of a light reception element, a DMT demodulator 32, a subcarrier (SC) monitor 33, and an SC monitor result transmitter 34.

The PD 31 converts a DMT modulated signal light received from the optical transmission line 50 into an electric signal having an amplitude corresponding to the received light power.

The DMT demodulator 32 performs a DMT-demodulation on an electric signal obtained by the PD 31 to obtain reception data. Thus, the DMT demodulator 32 may include, for example, a divider 321, a fast Fourier transformer (FFT) 322, a de-mapper 323, and a parallel to serial (P/S) converter 324.

The divider 321 divides an electric signal input from the PD 31 into signals corresponding to the subcarriers to input the signals into the FFT 322.

The FFT 322 performs FFT processing on each of the signals input from the divider 321 to convert the signals in the time domain into signals in a frequency domain.

The de-mapper 323 performs a subcarrier demodulation (or a DMT demodulation) on a received signal by identifying a reception symbol on the IQ plane from a signal in the frequency domain obtained by the FFT 322 and extracting (or de-mapping) bits mapped to the reception symbol.

The DMT-demodulated received signal for each subcarrier (or subcarrier signal) is P/S-converted by the P/S converter 324 and output as serial reception data.

The subcarrier monitor 33 monitors (or measures), for example, one or more of reception characteristics of the subcarrier signal input from the de-mapper 323 to the P/S converter 324. Examples of reception characteristics may include the SNR and/or the BER.

The subcarrier signal to be input to the subcarrier monitor 33 may be fixed to a signal of a preset subcarrier number or may be changeable to a signal of a different subcarrier number in accordance with the settings. For example, one or more of subcarrier signals output from the de-mapper 323 may selectively be input to the subcarrier monitor 33 by providing a selector in an input stage of the subcarrier monitor 33 and setting the selector.

The subcarrier monitor result transmitter 34 transmits (or feedbacks) a reception characteristic (in other words, monitor result) of the subcarrier signal monitored (or measured) by the subcarrier monitor 33 to the laser drive controller 14 of the optical transmitter 10. The subcarrier monitor result transmitter 34 may be implemented by using an OSC transmission unit which superimposes the monitor result on an OSC light transmitted to the optical transmitter 10.

Next, a setting example of a subcarrier to be monitored (hereinafter, may be referred to as a "monitor subcarrier") by the subcarrier monitor 33 will be described. The monitor subcarrier may be set to a subcarrier corresponding to a frequency that affects, as described above, characteristics of the DML 12. A setting example of the monitor subcarrier is illustrated in FIGS. 8 and 9.

Figure 8:
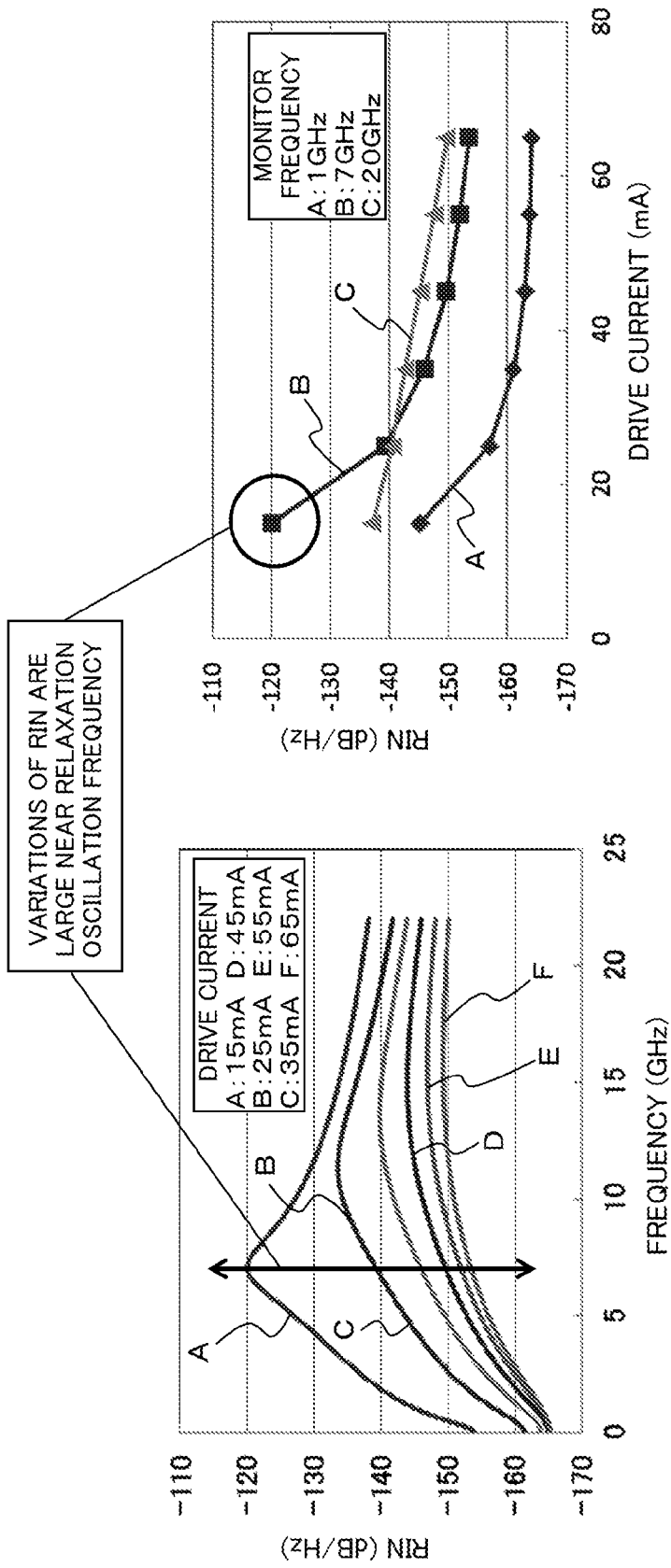
FIGS. 8 to 10 are diagrams each illustrating a setting example of a monitor carrier in an optical receiver illustrated in FIG. 1.

Graphs A to F illustrated on the left side of FIG. 8 illustrate examples of, similar to FIG. 7, the RIN characteristic with respect to the frequency, which is one of laser characteristics. Graphs A to C illustrated on the right side of FIG. 8 illustrate examples of the RIN characteristic for a drive current when the frequency is 1 GHz, 7 GHz, and 20 GHz, respectively.

As understood from FIG. 8, since the frequency of 7 GHz corresponds to a frequency near a relaxation oscillation frequency of the DML 12, variations of the RIN caused by a change of the drive current tend to be larger than other frequencies. Therefore, when the monitor subcarrier at the subcarrier monitor 33 is set to a subcarrier corresponding to 7 GHz, it is possible to sensitively monitor an influence of the RIN characteristic which is one of the laser characteristics on the transmission characteristic of the DMT modulated signal. The relaxation oscillation frequency may correspond to a threshold frequency for a response characteristic to a drive current. In a frequency region exceeding the threshold frequency, since a wavelength (or frequency) chirping occurs in output light of the DML 12, a response characteristic with respect to a drive current deteriorates sharply.

Figure 9:
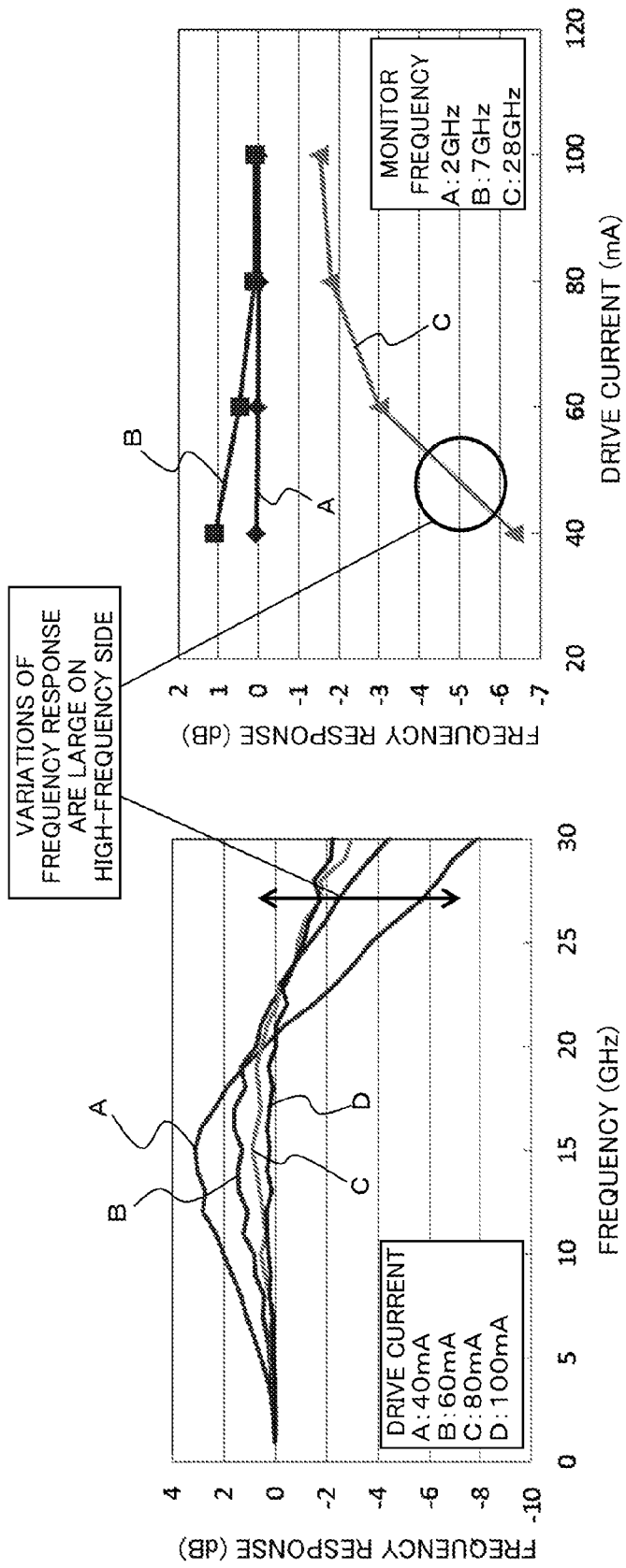

Graphs A to D illustrated on the left side of FIG. 9 illustrate examples of, similar to FIG. 6, the frequency characteristic as one of laser characteristics. Graphs A to C illustrated on the right side of FIG. 9 illustrate examples of the frequency response characteristic for a drive current when the frequency is 2 GHz, 7 GHz, and 28 GHz, respectively.

As understood from FIG. 9, changes of the frequency response caused by a change of the drive current tend to be larger when the frequency is 28 GHz than when the frequency is any other frequency. Therefore, among 2 GHz, 7 GHz, and 28 GHz, the monitor subcarrier may be set to a subcarrier corresponding to 28 GHz on a higher frequency side. Accordingly, it is possible to sensitively monitor an influence of the frequency characteristic (in other words, frequency response) which is one of the laser characteristics on the transmission characteristic of the DMT modulated signal.

Figure 10:
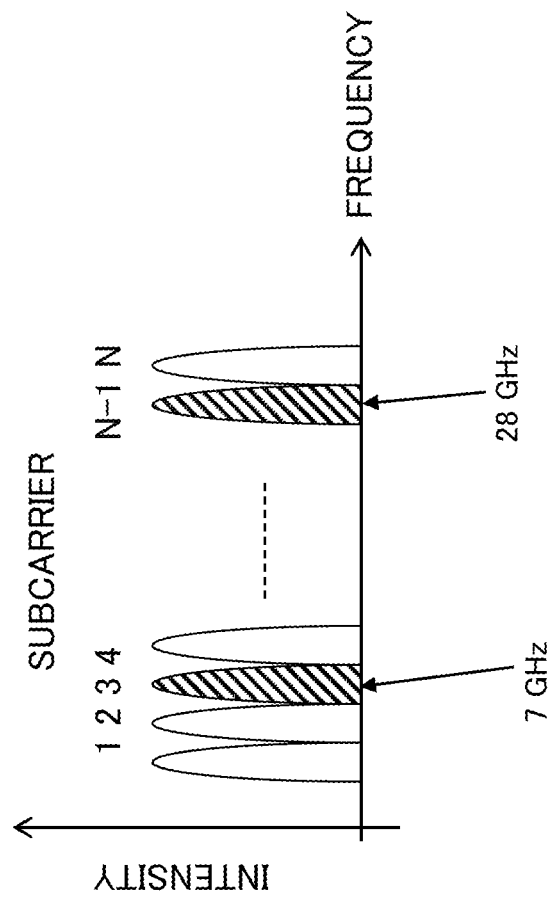

In view of the above, as illustrated in FIG. 10, two subcarriers of 7 GHz and 28 GHz may be set as the monitor subcarriers in the present embodiment as a non-restrictive example and the subcarrier monitor 33 monitors the reception characteristic of each subcarrier.

The laser drive controller 14 recognizes an operating state of the DML 12 from a monitor result of each monitor subcarrier to control drive conditions of the DML 12. For example, the laser drive controller 14 determines operation conditions of the DML 12 with reference to the table 141 in which the reception characteristic is associated with the drive conditions of the DML 12, based on the reception characteristic of a subcarrier signal monitored by the subcarrier monitor 33.

FIG. 11 illustrates an example of the table 141 stored in a storage unit such as a memory provided in the laser drive controller 14. FIG. 11 illustrates a case where four entries are set to the table 141. Each entry has a combination of the SNR, the bias current and the drive amplitude. The SNR is an example of the reception characteristic. The bias current and the drive amplitude are examples of drive conditions.

The first entry has data to set the bias current and the drive amplitude of the DML 12 to 60 mA and 40 mA, respectively, when the reception characteristics (for example, SNRs) of monitor carriers of 7 GHz and 28 GHz are 20 dB and 10 dB, respectively.

The second entry has data to set the bias current and the drive amplitude of the DML 12 to 80 mA and 40 mA, respectively, when SNRs of the respective monitor carriers are 20 dB and 12 dB.

The third entry has data to set the bias current and the drive amplitude of the DML 12 to 60 mA and 60 mA, respectively, when SNRs of the respective monitor carriers are 25 dB and 10 dB.

The fourth entry has data to set the bias current and the drive amplitude of the DML 12 to 80 mA and 60 mA, respectively, when SNRs of the respective monitor carriers are 25 dB and 12 dB.

The laser drive controller 14 may select one of the above four entries based on the reception characteristics of the monitor subcarriers and to set and control the DML driver 13 to the laser drive conditions indicated in the selected entry.

Instead of using the table 141, the laser drive controller 14 may control laser drive conditions by, for example, calculating a formula or an approximation formula created from the content of the table 141. However, the response speed of drive control can be speeded-up by using the table 141.

Operation Example

Figure 12:
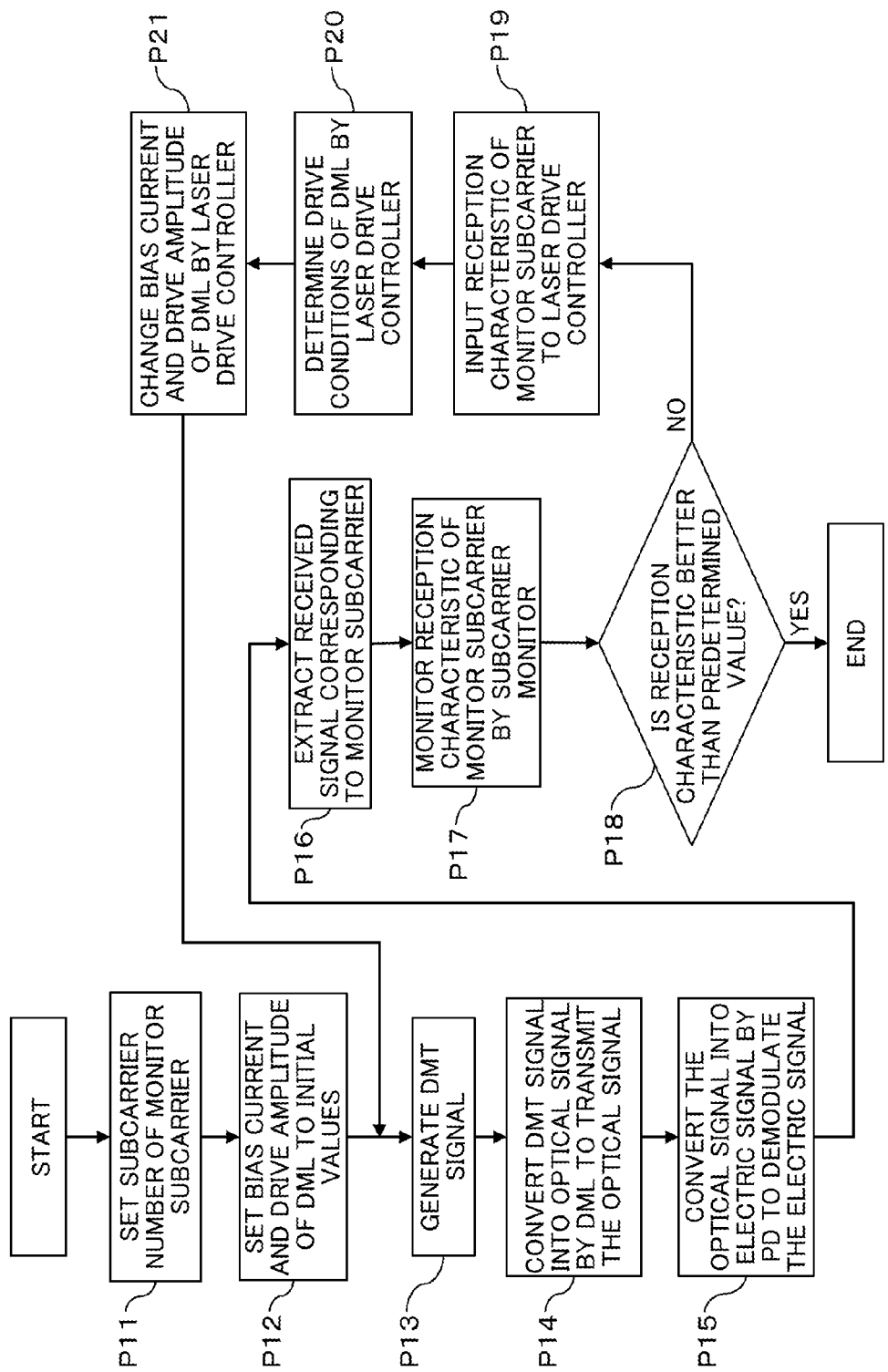
FIG. 12 is a flow chart illustrating a transmission method performed by the multi-carrier optical transmission system illustrated in FIG. 1.

Next, an example of the drive control for the DML 12 in the multi-carrier optical transmission system 1 will be described with reference to the flow chart illustrated in FIG. 12.

First, the monitor subcarrier number is set to the subcarrier monitor 33 and the laser drive controller 14 (Process P11) and initial values of drive conditions (for example, the bias current and the drive amplitude) of the DML 12 are set to the laser drive controller 14 (Process P12).

The optical transmitter 10 generates a DMT modulated signal by the DMT modulator 11 (Process P13) and amplifies the DMT modulated signal by the DML driver 13 to satisfy the drive conditions (the initial values) determined by the laser drive controller 14 to input the amplified DMT modulated signal into the DML 12 as a drive current. Thereby, the DMT modulated signal is converted into an optical signal (in other words, a DMT modulated signal light) by the DML 12 and is transmitted to the optical transmission line 50 (Process P14).

The optical receiver 30 receives the DMT modulated signal light from the optical transmission line 50 by the PD 31, converts the DMT modulated signal light into an electric signal corresponding to the received light power, and demodulates the electric signal by the DMT demodulator 32 (Process P15). In this regard, the DMT demodulator 32 extracts a received signal corresponding to the monitor subcarrier number set in Process P11 to input the extracted signal to the subcarrier monitor 33 (Process P16).

The subcarrier monitor 33 monitors the reception characteristic of the signal corresponding to the monitor subcarrier input from the DMT demodulator 32 (Process P17). The subcarrier monitor 33 determines whether the reception characteristic of the monitored subcarrier signal indicates a value better than a predetermined value (Process P18).

For example, when the reception characteristic is monitored (or measured) as the BER, the subcarrier monitor 33 determines whether the monitored BER is smaller than a threshold thereof. Meanwhile, when the reception characteristic is monitored (or measured) as the SNR, for example, the subcarrier monitor 33 determines whether the monitored SNR is larger than a threshold thereof.

As a result of the determination, when the reception characteristic of the monitored subcarrier signal is better than the predetermined value (YES in Process P18), there is no need to change drive conditions of the DML 12. Thus, the subcarrier monitor 33 may terminate the process without providing the monitor result to the subcarrier monitor result transmitter 34.

Meanwhile, when the reception characteristic of the monitored subcarrier signal is not better than the predetermined value (for example, the monitored BER is equal to or larger than the threshold, or the monitored SNR is equal to or smaller than the threshold) (NO in Process P18), the subcarrier monitor 33 provides the monitor result to the subcarrier monitor result transmitter 34. The subcarrier monitor result transmitter 34 transmits the monitor result to the optical transmitter 10 and the optical transmitter 10 provides the received monitor result to the laser drive controller 14 (Process P19).

The laser drive controller 14 determines drive conditions of the DML 12 (Process P20) with reference to the table 141 illustrated in FIG. 11 based on the reception characteristic of the provided signal corresponding to the monitor subcarrier to control the DML driver 13 such that the determined drive conditions are satisfied. Thereby, the drive conditions of the DML 12 are changed from the initial values thereof (Process P21). Therefore, the monitor result obtained by the optical receiver 30 is an example of control information to control drive conditions of the DML 12 in the optical transmitter 10.

After the drive conditions are changed, the process returns to Process P13 and a DMT modulated signal light is to transmitted from the optical transmitter 10 to the optical transmission line 50 again. Hereinafter, processes described in Process P13 to Process P21 are repeated until the reception characteristic of the monitor subcarrier indicates a value better than the threshold (until determined YES in Process P18).

According to the above embodiment, as described above, one reception characteristic (for example, the BER, the SNR or the like) of (one or more of) subcarrier signals included in a DMT modulated signal is monitored and drive conditions (for example, the bias current and the drive amplitude) of the DML 12 are controlled based on the monitor result.

Therefore, it is possible to optimize the drive conditions of the DML 12 and to suppress the deterioration of the transmission characteristic of the DMT modulated signal due to the laser characteristics such as the frequency characteristic (in other words, the frequency response) and the RIN characteristic.

Here, by setting the monitor subcarrier to a subcarrier that impacts on the transmission characteristic of the DMT modulated signal due to the laser characteristics than any other frequency, it is possible to sensitively monitor (or detect) variations of the transmission characteristic of the DMT modulated signal.

For example, by setting the monitor subcarrier to a subcarrier near the relaxation oscillation frequency (for example, 7 GHz), it is possible to sensitively monitor variations of the transmission characteristic due to the RIN characteristic of the DML 12. Therefore, it is possible to optimize the drive conditions of the DML 12 reliably in accordance with variations of the transmission characteristic due to the RIN characteristic.

Also, by setting the monitor subcarrier to a subcarrier on the high-frequency side (for example, 28 GHz), it is also possible to monitor variations of the transmission characteristic due to the frequency response of the DML 12. Therefore, it is possible to optimize drive conditions of the DML 12 reliably in accordance with variations of the transmission characteristic due to the frequency response.

Further, the laser drive controller 14 determines (or controls) the drive conditions based on the table 141 illustrated in FIG. 11 in which the correspondence between the reception characteristic of the monitor subcarrier and the drive conditions of the DML 12 are defined. Therefore, it is possible to improve a response speed of the drive control of the DML 12.

In the embodiment described above, as a non-restrictive example, two subcarriers of 7 GHz and 28 GHz are set as the monitor subcarriers but a single monitor subcarrier (for example, one of 7 GHz and 28 GHz) may be set. Further, three subcarriers or more may be set as the monitor subcarriers.

According to the technology described above, it is possible to suppress the deterioration of transmission characteristic by optimizing the drive conditions of the light source applied to the multi-carrier optical transmission system.

All examples and conditional language provided herein are intended for pedagogical purposes to aiding the reader in understanding the invention and the concepts contributed by the inventor to further the art and are not to be construed as limitations to such specifically recited examples and conditions, nor does the organization of such examples in the specification relate to a showing of the superiority and inferiority of the invention. Although one or more embodiment(s) of the present invention have been described in detail, it should be understood that the various changes, substitutions, and alterations could be made hereto without departing from the spirit and scope of the invention.

What is claimed is:

1. A multi-carrier optical transmission system comprising:
    an optical transmitter configured to include a light source and to transmit a multi-carrier modulated signal light by controlling a bias current and a drive amplitude of the light source with a modulated signal modulated by using a multi-carrier modulation scheme; and
    an optical receiver configured to receive the multi-carrier modulated signal light transmitted by the optical transmitter to demodulate the modulated signal,
    wherein the optical receiver includes:
    a monitor configured to monitor a reception characteristic of any of subcarrier signals included in the modulated signal; and
    a transmission unit configured to transmit a monitor result containing a bit error rate or a signal to noise ratio obtained by the monitor to the optical transmitter, and
    wherein the optical transmitter includes:
    a controller configured to store a correspondence among the monitor result, the bias current, and the drive amplitude in advance, and control the bias current and the drive amplitude based on the monitor result received from the optical receiver and the correspondence,
    wherein the subcarrier signal to be monitored by the monitor has a frequency at which variations of a frequency response caused by a change of a drive current of the light source are greater than those at any other frequency.

2. The multi-carrier optical transmission system according to claim 1, wherein the frequency to be monitored by the monitor corresponds to a frequency at which variations of a relative intensity noise caused by a change of the drive current of the light source are greater than those at any other frequency.

3. The multi-carrier optical transmission system according to claim 2, wherein the frequency to be monitored by the monitor corresponds to a relaxation oscillation frequency of the light source.

4. The multi-carrier optical transmission system according to claim 1, wherein the multi-carrier modulation scheme is a discrete multi-tone modulation scheme.

5. The multi-carrier optical transmission system according to claim 1, wherein the reception characteristic is the bit error rate or the signal to noise ratio.

6. An optical transmitter comprising:
a multi-carrier modulator configured to generate a modulated signal modulated by using a multi-carrier modulation scheme;
a light source driven with the modulated signal to transmit a multi-carrier modulated signal light by controlling a bias current and a drive amplitude of the light source; and
a controller configured to store a correspondence among a monitor result obtained by a monitor included in an optical receiver which received the multi-carrier modulated signal light, the bias current, and the drive amplitude in advance, and control the bias current and the drive amplitude based on a monitored reception characteristic of any of subcarrier signals included in the modulated signal, the monitored reception characteristic being monitored by the optical receiver,
wherein the subcarrier signal to be monitored by the optical receiver has a frequency at which variations of a frequency response caused by a change of a drive current of the light source are greater than those at any other frequency.

7. An optical receiver to receive and demodulate a multi-carrier modulated signal light, the optical receiver comprising:
a monitor configured to monitor a reception characteristic of any of subcarrier signals included in a modulated signal, the multi-carrier modulated signal light being transmitted by an optical transmitter configured to include a light source and to transmit the multi-carrier modulated signal light by controlling a bias current and a drive amplitude of the light source with the modulated signal modulated by using a multi-carrier modulation scheme; and
a transmission unit configured to transmit a monitor result containing a bit error rate or a signal to noise ratio obtained by the monitor to the optical transmitter as control information to control the bias current and the drive amplitude,
wherein the subcarrier signal to be monitored by the monitor has a frequency at which variations of a frequency response caused by a change of a drive current of the light source are greater than those at any other frequency.

8. The optical receiver according to claim 7, wherein the frequency corresponds to a frequency at which variations of a relative intensity noise caused by a change of the drive current of the light source are greater than those at any other frequency.

9. The optical receiver according to claim 8, wherein the frequency to be monitored by the monitor corresponds to a relaxation oscillation frequency of the light source.

10. The optical receiver according to claim 7, wherein the multi-carrier modulation scheme is a discrete multi-tone modulation scheme.

11. The optical receiver according to claim 7, wherein the reception characteristic is the bit error rate or the signal to noise ratio.

* * * * *